(12) United States Patent
Yoon et al.

(10) Patent No.: US 9,960,373 B2
(45) Date of Patent: May 1, 2018

(54) SUBSTRATE FOR PHOTOELECTRIC DEVICE AND PHOTOELECTRIC DEVICE COMPRISING SAME

(71) Applicant: Corning Precision Materials Co., Ltd., Chungcheongnam-do (KR)

(72) Inventors: Hong Yoon, Chungcheongnam-do (KR); Soon Geun Kwon, Chungcheongnam-do (KR); Yoon Young Kwon, Chungcheongnam-do (KR); Kyung Wook Park, Chungcheongnam-do (KR); Hyun Hee Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 192 days.

(21) Appl. No.: 14/902,092

(22) PCT Filed: Jul. 2, 2014

(86) PCT No.: PCT/KR2014/005908
§ 371 (c)(1),
(2) Date: Dec. 30, 2015

(87) PCT Pub. No.: WO2015/002461
PCT Pub. Date: Jan. 8, 2015

(65) Prior Publication Data
US 2016/0301022 A1    Oct. 13, 2016

(30) Foreign Application Priority Data
Jul. 3, 2013    (KR) .......................... 10-2013-0077787

(51) Int. Cl.
*H01L 51/00*    (2006.01)
*H01L 31/0216*    (2014.01)
*H01L 31/0236*    (2006.01)
*H01L 51/44*    (2006.01)
*H01L 51/52*    (2006.01)

(52) U.S. Cl.
CPC .......... *H01L 51/0096* (2013.01); *H01L 51/44* (2013.01); *H01L 51/52* (2013.01);
(Continued)

(58) Field of Classification Search
CPC .................................................. H01L 51/0096
See application file for complete search history.

(56) References Cited

U.S. PATENT DOCUMENTS

2003/0219622 A1* 11/2003 Niebauer ................ B32B 15/01
428/663
2004/0004433 A1* 1/2004 Lamansky .......... H01L 51/5036
313/506
(Continued)

FOREIGN PATENT DOCUMENTS

JP    2007005030 A    1/2007
JP    2010508677 A    3/2010
(Continued)

OTHER PUBLICATIONS

International Search Report for Application No. PCT/KR2014/005908 dated Sep. 22, 2014.

*Primary Examiner* — Susan D Leong
(74) *Attorney, Agent, or Firm* — Lerner, David, Littenberg, Krumholz & Mentlik, LLP

(57) ABSTRACT

The present invention relates to a substrate for a photoelectric device and a photoelectric device comprising the same and, more specifically, to a substrate for a photoelectric device and a photoelectric device comprising the same capable of guaranteeing the flatness of thin-films forming the photoelectric device and the structural stability of a functional thin-film formed to improve the characteristics of the photoelectric device, thereby maintaining the function of the functional thin-film. To this end, the present invention provides a substrate for a photoelectric device and a photoelectric device comprising the same, the substrate comprising: a base substrate; a concave-convex structure formed on
(Continued)

the base substrate, in which the surface of the concave-convex structure forms a concave-convex pattern; and a planarization layer formed on the concave-convex structure, the planarization layer being formed of a 2-dimensional material.

7 Claims, 1 Drawing Sheet

(52) U.S. Cl.
CPC ........ *H01L 51/5268* (2013.01); *H01L 51/442* (2013.01); *H01L 51/5206* (2013.01); *Y02E 10/549* (2013.01)

(56) References Cited

U.S. PATENT DOCUMENTS

| | | | | |
|---|---|---|---|---|
| 2004/0018381 | A1* | 1/2004 | Aziz | H01L 51/5088 428/690 |
| 2005/0249974 | A1* | 11/2005 | Mori | H01L 51/5221 428/690 |
| 2007/0075313 | A1* | 4/2007 | Kwak | H01L 27/3276 257/59 |
| 2009/0071533 | A1* | 3/2009 | Choi | H01L 31/02246 136/252 |
| 2011/0073834 | A1* | 3/2011 | Hannon | H01L 29/16 257/9 |
| 2012/0068152 | A1* | 3/2012 | Hwang | H01L 29/78684 257/9 |
| 2012/0122274 | A1 | 5/2012 | Lazarev | |
| 2012/0164317 | A1 | 6/2012 | Kim et al. | |

FOREIGN PATENT DOCUMENTS

| | | |
|---|---|---|
| JP | 2012216592 A | 11/2012 |
| KR | 20120072201 A | 7/2012 |
| KR | 101176885 B1 | 8/2012 |

* cited by examiner

SUBSTRATE FOR PHOTOELECTRIC DEVICE AND PHOTOELECTRIC DEVICE COMPRISING SAME

CROSS REFERENCE TO RELATED APPLICATIONS

The present application is a national phase entry under 35 U.S.C. § 371 of International Application No. PCT/KR2014/005908, filed Jul. 2, 2014, which claims priority from Korean Application No. 10-2013-0077787, filed Jul. 3, 2013, all of which are incorporated herein by reference.

BACKGROUND OF THE INVENTION

Field of the Invention

The present invention relates to an optoelectronic device substrate and an optoelectronic device including the same, and more particularly, to an optoelectronic device substrate which can ensure that constituent thin films of an optoelectronic device be flat and that a functional thin film formed to improve the characteristics of the optoelectronic device be structurally stable so that the functional thin film maintains its function and an optoelectronic device including the same.

Description of Related Art

Next generation technologies and products that are currently in the spotlight include optoelectronics based on organic materials. For instance, typical optoelectronic devices include organic light-emitting diodes (OLEDs) which are used in mobile displays or for solid-state lighting (SSL) as well as organic photovoltaic cells in which a light-absorbing layer is formed from an organic material. As the results of studies focused on organic materials for optoelectronic devices, organic materials having considerable performance are being developed.

Such an optoelectronic device includes an organic/inorganic composite layer in which organic and inorganic materials are combined. Typical examples of inorganic materials used in the optoelectronic device include a transparent electrode, a reflective metal electrode, a glass substrate and the like. However, since a significant amount of optical loss occurs in inorganic materials due to different refractive indices, an improvement in optical efficiency is significantly limited.

In order to overcome this problem, in the related art, a nano-pattern having a patterned structure is formed in the front part of the optoelectronic device. However, when the nano-pattern is formed on the organic/inorganic composite layer of the optoelectronic device, it is impossible to ensure that thin films of the organic/inorganic composite layer be flat since the nano-pattern forms an uneven surface. When the nano-pattern is formed on the organic/inorganic composite layer, there is a high possibility that a localized sharp portion be formed on the organic/inorganic composite layer that is bonded to the nano-pattern. For instance, since an OLED has a multilayer structure consisting of very thin organic/inorganic films, the sharp protruding portion may be transferred from the nano-pattern to the anode that is bonded to the nano-pattern. Then, a current will be concentrated in that sharp protruding portion of the anode, which is a cause of a large leakage current or decreases power efficiency.

Therefore, in order to prevent such deterioration of electric characteristics, a planarization film is necessarily added.

However, perfectly planarizing the patterned nano-pattern using a thin planarization film having a thickness of several hundreds of nanometers is extremely difficult in an actual process. That is, in the related art in which a planarization film is deposited on the nano-pattern, since a material that forms the planarization film is deposited following the nano-pattern, the planarization film resembles the geometry of the nano-pattern and thus the flatness of the planarization film is very low.

The information disclosed in the Background of the Invention section is provided only for better understanding of the background of the invention and should not be taken as an acknowledgment or any form of suggestion that this information forms a prior art that would already be known to a person skilled in the art.

RELATED ART DOCUMENT

Patent Document 1: Korean Patent No. 10-1176885 (Aug. 20, 2012)

BRIEF SUMMARY OF THE INVENTION

Various aspects of the present invention provide an optoelectronic device substrate which can ensure that thin films of an optoelectronic device be flat and that a functional thin film formed to improve the characteristics of the optoelectronic device be structurally stable such that the functional thin film maintains its function and an optoelectronic device including the same.

In an aspect of the present invention, provided is an optoelectronic device substrate that includes: a base substrate; a patterned structure formed on the base substrate, the patterned structure having protruding portions and depressed portions on a surface thereof; and a planarization layer disposed on the patterned structure, the planarization layer being formed from a two-dimensional material.

The base substrate and the patterned structure may be formed as one body or as different bodies.

The two-dimensional material may be one selected from the group consisting of graphene, $MoS_2$, $MoSe_2$, hBN and $WSe_2$.

The planarization layer may be sheet-shaped.

The planarization layer may be a single layer or a multilayer. The multilayer includes a plurality of the single layers.

The thickness of the single layer may range from 0.3 to 0.9 nm.

The thickness of the multilayer may be 5 nm or less.

The transmittance of the planarization layer may be 90% or greater.

In a further aspect of the present invention, provided is an optoelectronic device that includes: the above-described optoelectronic device substrate; and an organic/inorganic composite layer adjoining to the planarization layer of the optoelectronic device substrate.

According to an embodiment of the present invention, the optoelectronic device may be an organic light-emitting device (LED).

The optoelectronic device may be a photovoltaic cell.

According to embodiments of the present invention, the planarization layer formed from the two-dimensional material is disposed between the functional thin film having the patterned structure and the organic/inorganic composite layer. This can consequently ensure that the organic/inorganic composite layer be flat, thereby preventing the electrical characteristics of the optoelectronic device from being deteriorated, and that the functional thin film be structurally stable, thereby continuously maintaining the optical function of the functional thin film.

In addition, since the planarization layer is formed as an ultra-thin film, it is possible to improve the accuracy of the design of the optoelectronic device.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
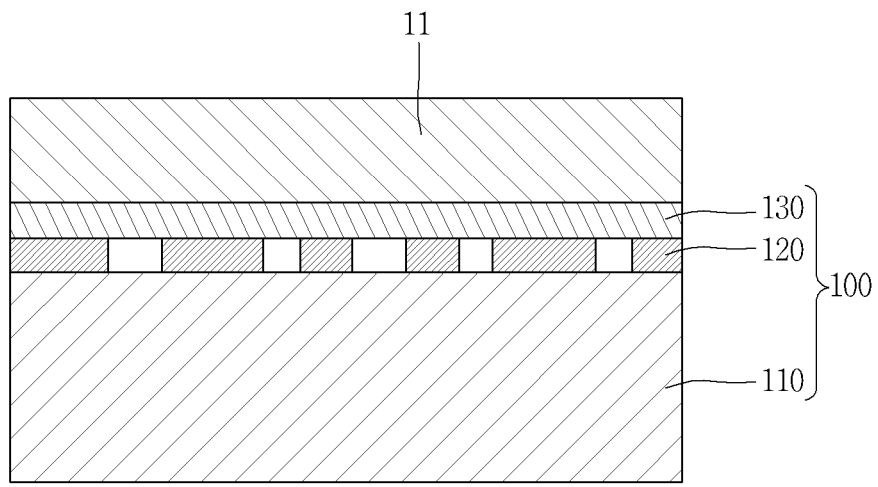
FIG. 1 is a schematic cross-sectional view showing an optoelectronic device substrate and an optoelectronic device including the same according to an exemplary embodiment of the present invention.

Reference will now be made in detail to an optoelectronic device substrate and an optoelectronic device including the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, an optoelectronic device substrate 100 according to an exemplary embodiment is the substrate for improving the optical characteristics of the optoelectronic such as an organic light-emitting device (OLED) or a photovoltaic cell. The optoelectronic device substrate 100 is disposed on one surface of an organic/inorganic composite layer 11 of the optoelectronic device 10.

When the optoelectronic device 10 is a photovoltaic cell, an organic/inorganic composite layer 11 may include a transparent conductive oxide electrode, a light-absorbing layer, a back electrode layer and an insulation film. Examples of a material for the light-absorbing layer can include single-crystal or polycrystalline silicon; semiconductor compounds, such as copper indium gallium selenide (CIGS) and cadmium telluride (CdTe); dye-sensitizers in which photosensitive dye molecules are adsorbed on the surface of nano particles of a porous film such that electrons are activated when the photosensitive dye molecules absorb visible light; amorphous silicon; etc.

In addition, when the optoelectronic device 10 is an OLED, the organic/inorganic composite layer 11 can be configured as a multilayer structure in which an anode, an organic light-emitting layer and a cathode are stacked. The anode can be formed from a metal or oxide, such as gold (Au), indium (In), tin (Sn) or indium tin oxide (ITO), which has a significant work function in order to facilitate the hole injection. The cathode can be formed from a metal thin film of, for example, Al, Al:Li or Mg:Ag, which has a smaller work function in order to facilitate the electron injection. In a top emission type OLED, the cathode can have a multilayer structure that includes a semitransparent electrode of a metal thin film formed from Al, Al:Li or Mg:Ag and a transparent electrode of an oxide thin film formed from, for example, ITO in order to facilitate the transmission of light generated from the organic light-emitting layer. The organic light-emitting layer includes a hole injection layer, a hole transport layer, an emissive layer, an electron transport layer and an electron injection layer which are sequentially stacked on the anode. With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and holes that have migrated into the emissive layer recombine with each other, thereby generating excitons. When these excitons transit from an excited state to a ground state, light is emitted. The brightness of the light emitted is proportional to the amount of current that flows between the anode and the cathode.

The optoelectronic device substrate 100 includes a base substrate 110, a patterned structure 120 and a planarization layer 130.

The base substrate 110 allows external light to enter when the optoelectronic device 10 is a photovoltaic cell and allows internal light to exit when the optoelectronic device 10 is an OLED. In addition, the base substrate 110 serves to protect inner components of the optoelectronic device 10, such as the organic/inorganic composite layer 11, the patterned structure 120 and the planarization layer 130, from the external environment.

As the base substrate 110, any transparent substrate can be used that has superior light transmittance and mechanical properties. For instance, the base substrate 110 can be formed from a polymeric material, such as a thermally or ultraviolet (UV) curable organic film, or a chemically strengthened glass of, for example, soda-lime ($SiO_2$—CaO—$Na_2O$) or aluminosilicate ($SiO_2$—$Al_2O_3$—$Na_2O$) When an OLED including the optoelectronic device substrate 100 according to this exemplary embodiment is used as an illumination device, the base substrate 110 can be formed from soda-lime glass. When the OLED is used in a display, the base substrate 110 can be formed from aluminosilicate glass. As the base substrate 110, a substrate formed from a metal oxide or a metal nitride can also be used. According to an embodiment of the present invention, the base substrate 110 can be formed from a piece of thin glass having a thickness of 1.5 mm or less. The thin glass can be made using a fusion process or a floating process.

The patterned structure 120 is disposed on the base substrate 110. The patterned structure 120 serves as a light-scattering layer to scatter light that enters or exits the optoelectronic device 10 through the patterned structure 120. When the patterned structure 120 having the light-scattering function is formed on top of the transparent electrode of a photovoltaic cell or the anode of an OLED, i.e. the patterned structure 120 is disposed between the base substrate 110 and the organic/inorganic composite layer 11, a significant amount of light can be extracted while passing through the interface between media having different refractive indices. This can consequently improve both the light trapping efficiency of the photovoltaic cell and the light extraction efficiency of the OLED.

The patterned structure 120 according to this exemplary embodiment can include protruding portions and depressed portions that are randomly distributed. The random distribution of the protruding portions and depressed portions of the patterned structure 120 allows a more amount of light to be extracted while passing through the interface between media having different refractive indices, thereby further improving light efficiency.

The patterned structure 120 can have the shape of a grid in a plan view.

The planarization layer 130 is disposed on the patterned structure 120. Specifically, the planarization layer 130 is disposed between the organic/inorganic composite layer 11 and the patterned structure 120. The planarization layer 130 is formed in order to prevent the phenomenon that current is concentrated on protruding portions that are formed on the surface of the organic/inorganic composite layer 11 by the patterned structure 120. That is, the planarization layer 130 serves as a buffer layer that is disposed between the patterned structure 120 and the organic/inorganic composite layer 11 in order to planarize the surface of the patterned structure 120.

In order to prevent the optical characteristics of the optoelectronic device 10 from being deteriorated by the planarization layer 130 which serves as the buffer layer, the planarization layer 130 must be formed from a material that has a transmittance of 90% or greater.

If the planarization layer 130 is too thick, the light-scattering effect may be reduced since the distance between the patterned structure 120 and the organic/inorganic composite layer 11 is too long. Therefore, the planarization layer 130 must be formed from an ultra-thin film having high flatness. Accordingly, the planarization layer 130 according to this exemplary embodiment is formed from a two-dimensional material. For instance, the planarization layer 130 can be formed from one selected from among, but not limited to, graphene, $MoS_2$, $MoSe_2$, hBN and $WSe_2$. Graphene is the thinnest material, consisting of a single layer of carbon atoms. Graphene has superior thermal, electrical and mechanical characteristics. Thus, when the planarization layer 130 is formed from graphene that is a two-dimensional material, the planarization layer 130 can be formed as an ultra-thin film having high flatness. In addition, when the planarization layer 130 is formed from graphene, the planarization layer 130 can be sheet-shaped. In this manner, when the sheet-shaped planarization layer 130 is formed on the patterned structure 120, the depressed portions of the patterned structure 120 are left as pores which can maximize the light-scattering effect of the patterned structure 120. In the related art, the planarization layer was formed by depositing a material that is to form the planarization layer on the patterned structure or coating the patterned structure with a liquid that is to form the planarization layer. In contrast, according to this exemplary embodiment, when the sheet-shaped planarization layer 130 is formed, it is possible to more simplify the fabrication process and more easily adjust the thickness than in the related art. When the planarization layer 130 is formed from sheet-shaped graphene, it is possible to form the planarization layer 130 as an ultra-thin film by adjusting its thickness.

The planarization layer 130 can be bonded with the organic/inorganic composite layer 11 by Van der Waals force. In addition, the sheet-shaped planarization layer 130 can be formed as a single layer or a multilayer. The multilayer consists of an n number of single layers that are stacked, where n is a natural number. When the planarization layer 130 is formed as a single layer, the thickness of the planarization layer 130 may range from 0.3 to 0.9 nm. In addition, the planarization layer 130 must be also formed as an ultra-thin film when it is formed as a multilayer in which a plurality of single layers are stacked. It is therefore preferred that the overall thickness of the planarization layer 130 be 5 nm or less.

In the optoelectronic device substrate 100 according to this exemplary embodiment as described above, the ultra-thin planarization layer 130 disposed between the organic/inorganic composite layer 11 and the patterned structure 120 is formed from a sheet-shaped two-dimensional material and has high flatness. The planarization layer 130 can consequently ensure that the organic/inorganic composite layer 11 be flat, thereby preventing the electrical characteristics of the optoelectronic device 10 from being deteriorated, and that the patterned structure 120 continuously maintain its own optical function.

In addition, in the optoelectronic device substrate 100 according to this exemplary embodiment, the planarization layer 130 can be a sheet-shaped single layer or multilayer. When the planarization layer 130 is sheet-shaped, it is possible to improve the accuracy of the design of an optoelectronic device since the thickness of the planarization layer 130 that is to be formed can be predicted.

Reference will now be made to an optoelectronic device substrate according to another embodiment of the present invention in conjunction with FIG. 2.

Figure 2:
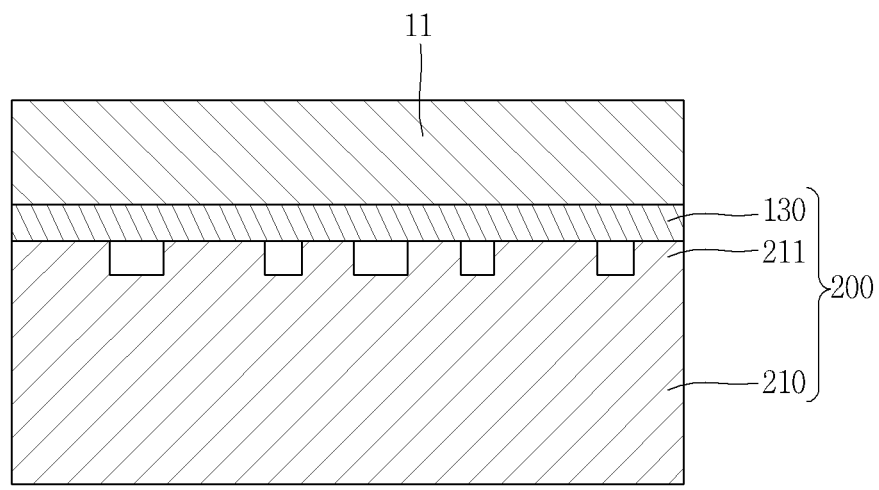
FIG. 2 is a schematic cross-sectional view showing an optoelectronic device substrate and an optoelectronic device including the same according to another exemplary embodiment of the present invention.

FIG. 2 is a schematic cross-sectional view showing an optoelectronic device substrate and an optoelectronic device including the same according to another exemplary embodiment of the present invention.

As shown in FIG. 2, the optoelectronic device substrate 200 according to this exemplary embodiment includes a base substrate 210 and a planarization layer 130.

The optoelectronic device substrate 200 according to this exemplary embodiment is substantially the same as the optoelectronic device substrate 100 according to the former exemplary embodiment, except that the base substrate 210 is integrally provided with a patterned structure 211. Thus, the same reference numerals will be used to designate the same components and detailed descriptions thereof will be omitted.

According to this exemplary embodiment, the patterned structure 211 is formed on one surface of the base substrate 210. Like the patterned structure 210 according to the former exemplary embodiment, the patterned structure 120 serves as a light-scattering layer in the optoelectronic device 20. Specifically, when the optoelectronic device 20 is an OLED, the patterned structure 120 serves to scatter light that exits the patterned structure 120. When the optoelectronic device 20 is a photovoltaic cell, the patterned structure 120 serves to scatter light that enters through the patterned structure 120. The patterned structure 211 according to this exemplary embodiment has protruding portions and depressed portions that are randomly distributed and performs the same function as the patterned structure 120 according to the former exemplary embodiment.

The patterned structure 211 according to this exemplary embodiment is formed by patterning one surface of the base substrate 210 by a suitable process, such as lithography. In this manner, the optoelectronic device 20 according to this exemplary embodiment may be more structurally stable than the optoelectronic device 10 according to the former exemplary embodiment and can be made compact.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. An optoelectronic device substrate comprising:
   a base substrate;
   a patterned structure formed on the base substrate; and
   a planarization layer disposed on the patterned structure, the planarization layer being formed from a two-dimensional material,
   wherein the base substrate and the patterned structure are formed as one body,
   wherein the planarization layer comprises a multilayer formed from a plurality of single layers,
   wherein a thickness of the multilayer is 5 nm or less.

2. The optoelectronic device substrate according to claim 1, wherein the two-dimensional material comprises one selected from the group consisting of graphene, $MoS_2$, $MoSe_2$, hBN and $WSe_2$.

3. The optoelectronic device substrate according to claim 1, wherein the planarization layer is sheet-shaped.

4. The optoelectronic device substrate according to claim 1, wherein a transmittance of the planarization layer is 90% or greater.

5. An optoelectronic device comprising:
   the optoelectronic device substrate as claimed in claim 1; and
   an organic/inorganic composite layer adjoining to the planarization layer of the optoelectronic device substrate.

6. The optoelectronic device according to claim 5, wherein the optoelectronic device is an organic light-emitting device.

7. The optoelectronic device according to claim 5, wherein the optoelectronic device is a photovoltaic cell.

* * * * *